US009142271B1

(12) United States Patent
Srinivasan et al.

(10) Patent No.: US 9,142,271 B1
(45) Date of Patent: Sep. 22, 2015

(54) REFERENCE ARCHITECTURE IN A CROSS-POINT MEMORY

(71) Applicant: Intel Corporation, Santa Clara, CA (US)

(72) Inventors: Balaji Srinivasan, Hillsboro, OR (US);
Doyle Rivers, El Dorado Hills, CA (US);
Derchang Kau, Cupertino, CA (US);
Matthew Goldman, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/313,695

(22) Filed: Jun. 24, 2014

(51) Int. Cl.
G11C 7/00 (2006.01)
G11C 7/12 (2006.01)

(52) U.S. Cl.
CPC .......................................... *G11C 7/12* (2013.01)

(58) Field of Classification Search
CPC ......... G11C 7/12; G11C 11/4094; G11C 7/22
USPC ................................ 365/203, 189.14, 189.15
See application file for complete search history.

(56) References Cited

U.S. PATENT DOCUMENTS 7,310,257 B2 * 12/2007 Manning et al. ................ 365/63
7,692,986 B2 * 4/2010 Kajigaya ....................... 365/203

FOREIGN PATENT DOCUMENTS

WO  2013184111  12/2013

OTHER PUBLICATIONS

Kobayashi, et al., "A Current-Controlled Latch Sense Amplifier and a Static Power—Saving Input Buffer for Low-Power Architecture", IEEE Journal of Solid-State Circuits, vol. 28, No. 4, Apr. 1993.
Suzuki, et al., "Threshold Difference Compensated Sense Amplifier", IEEE Journal of Solid-State Circuits., vol. SC-14, No. 6, Dec. 1979.

* cited by examiner

*Primary Examiner* — Son Dinh
(74) *Attorney, Agent, or Firm* — Grossman, Tucker, Perreault & Pfleger, PLLC

(57) ABSTRACT

The present disclosure relates to reference and sense architecture in a cross-point memory. An apparatus may include a memory controller configured to select a target memory cell for a memory access operation. The memory controller includes word line (WL) switch circuitry configured to select a global WL (GWL) and a local WL (LWL) associated with the target memory cell; bit line (BL) switch circuitry configured to select a global BL (GBL) and a local BL (LBL) associated with the target memory cell; and sense circuitry including a first sense circuitry capacitance and a second sense circuitry capacitance, the sense circuitry configured to precharge the selected GWL, the LWL and the first sense circuitry capacitance to a WL bias voltage WLVDM, produce a reference voltage ($V_{REF}$) utilizing charge on the selected GWL and charge on the first sense circuitry capacitance and determine a state of the target memory cell based, at least in part, on $V_{REF}$ and a detected memory cell voltage $V_{LWL}$.

24 Claims, 6 Drawing Sheets

REFERENCE ARCHITECTURE IN A CROSS-POINT MEMORY

FIELD

The present disclosure relates to a reference and sense architecture in a cross-point memory array.

BACKGROUND

Phase change memory is a memory device which typically uses a chalcogenide material for the memory elements. A memory element is the unit that actually stores information. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory elements may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

During a programming operation, the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state. Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage across the memory element is configured to be greater than a maximum set voltage and less than a minimum reset voltage for the memory element. In response, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
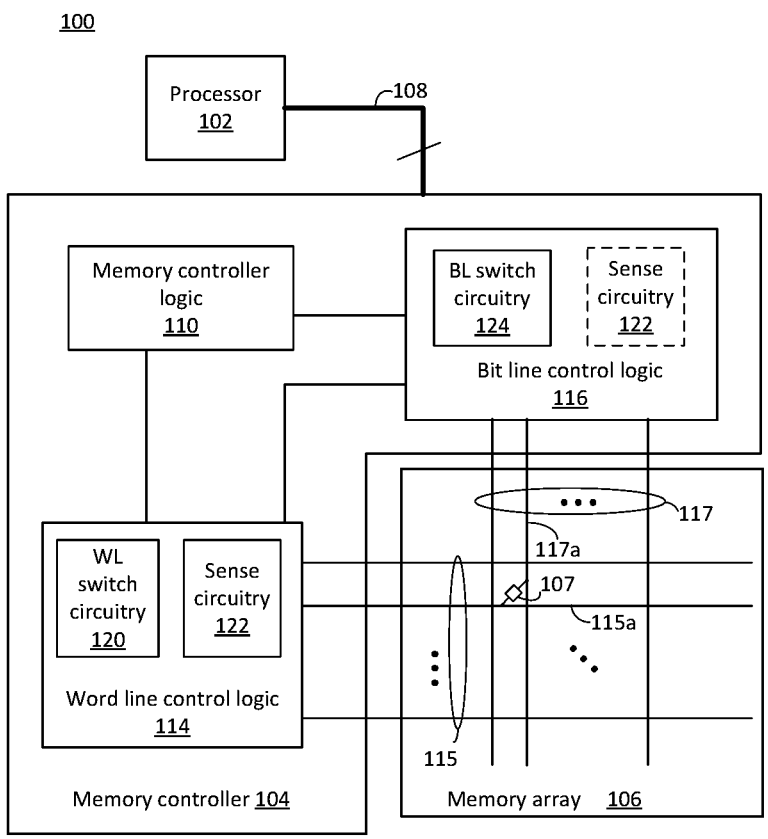
FIG. 1 illustrates a system block diagram consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

During a read operation, sense circuitry is configured to detect whether or not a snap back has occurred based, at least in part, on whether a current flows in the memory cell. The current may be detected by a change in charge detected as a change in voltage on a local word line (LWL). The voltage change may be relatively small and is typically determined relative to a reference voltage. Externally generated reference voltages require conductive paths from a reference supply voltage to the sensing circuitry in order to provide the reference voltage to the sensing circuitry. The conductive paths may then add to a die size associated with a memory array. Generating the reference voltage further increases energy consumption associated with the memory array.

Generally, this disclosure describes a system and method configured to locally produce a reference voltage for reading memory cells. The system and method are configured to utilize inherent capacitances associated with a local WL and a global WL, a first sense circuitry capacitance, e.g., capacitance of lines coupling the WL to sense circuitry, and a bias voltage applied as part of a memory access operation. The bias voltage charges the inherent capacitances. A resulting charge on the inherent capacitances may then be utilized to produce the reference voltage. A value of the reference voltage is based, at least in part, on relative values of the inherent capacitances, including, e.g., a second sense circuitry capacitance, as described herein. In an embodiment, an unselected global WL from an unselected adjacent memory portion may be coupled to the sensing circuitry providing an adjustment capacitance configured to adjust the reference voltage, as described herein. In another embodiment, trim capacitor circuitry may provide additional capacitance (i.e., adjustment capacitance) configured to produce a desired reference voltage. For example, the trim capacitor circuitry may correspond to a binary weighted trim capacitor configured to provide selectable capacitances that are a multiple of a nominal capacitance. The multiple is determined by a binary selector value applied to the binary weighted capacitor. The reference voltage may be adjusted by changing the binary selector value. For example, the reference voltage may be adjusted to optimize a sense margin between a maximum set voltage and a minimum reset voltage for the memory cell.

The system and method may further include a sense amplifier. The reference voltage is applied to a first input and a sense voltage related to the reference voltage and an output of a selected memory cell (i.e., detected memory cell voltage) is applied to a second input of the sense amplifier. The first input and the second input of the sense amplifier may be coupled, prior to application of the sense voltage, in order to produce the reference voltage. This coupling may enhance noise rejection by making noise at the first input and the second input common mode. The sense amplifier may then provide noise immunity (i.e., common mode noise rejection) when the first input and second input are decoupled and the sense voltage is applied to the second input. The sense amplifier is configured to receive the sense voltage and the reference voltage and to provide a logic level output, i.e., logic one or logic zero, corresponding to $V_{CC}$ or $V_{SS}$ based, at least in part, on relative values of the reference voltage and the sense voltage. For example, $V_{CC}$ may have a value of 1.2 volts and $V_{SS}$ may correspond to ground (i.e., zero volts).

In the following, techniques for local reference voltage production and memory cell output sensing are described with respect to word lines. Similar techniques may be utilized to produce local reference voltages and memory cell sensing in a cross-point memory for bit lines, consistent with the present disclosure.

FIG. 1 illustrates a system block diagram 100 consistent with several embodiments of the present disclosure. The system 100 includes a processor 102, a memory controller 104 and a memory array 106. The processor 102 is coupled to the memory controller 104 by bus 108. Processor 102 may provide read and/or write requests including memory address(es), and/or associated data to memory controller 104 and may receive read data from memory controller 104. Memory controller 104 is configured to perform memory access operations, e.g., reading a target memory cell and/or writing to a target memory cell. It should be noted that system 100 is simplified for ease of illustration and description.

Memory array 106 corresponds to at least a portion of a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 106 is configured to store binary data and may be written to (i.e., programmed) or read from.

Memory controller 104 includes memory controller logic 110, WL control circuitry 114 and BL control logic 116. Memory controller logic 110 is configured to perform operations associated with memory controller 104. For example, memory controller logic 110 may manage communications with processor 102. Memory controller logic 110 may be configured to identify one or more target WLs associated with each received memory address. Memory controller logic 110 may be configured to manage operations of WL control logic 114 and BL control logic 116 based, at least in part, on the target WL identifiers.

WL control logic 114 includes WL switch circuitry 120 and sense circuitry 122. WL control logic 114 is configured to receive target WL address(es) from memory controller logic 110 and to select one or more WLs for reading and/or writing operations. For example, WL control logic 114 may be configured to select a target WL by coupling a WL select bias voltage to the target WL. WL control logic 114 may be configured to deselect a WL by decoupling the target WL from the WL select bias voltage and/or by coupling a WL deselect bias voltage to the WL. WL control logic 114 may be coupled to a plurality of WLs 115 included in memory array 106. Each WL may be coupled to a number of memory cells corresponding to a number of BLs 117. WL switch circuitry 120 may include a plurality of switches, each switch configured to couple (or decouple) a respective WL, e.g., WL 115a, to WL select bias voltage to select the respective WL 115a. For example, switch circuitry 120 may include a plurality of transistors.

BL control logic 116 includes BL switch circuitry 124. In some embodiments BL control logic 116 may include sense circuitry, e.g., sense circuitry 122. BL control logic 116 is configured to select one or more BLs for reading and/or writing operations. BL control logic 116 may be configured to select a target BL by coupling a BL select bias voltage ($V_{PP}$) to the target BL. For example, $V_{PP}$ may have a value of 5.0 volts. BL control logic 116 may be configured to deselect a BL by decoupling the target BL from the BL select bias voltage and/or by coupling a BL deselect bias voltage to the BL. BL switch circuitry 124 is similar to WL switch circuitry 120 except BL switch circuitry 124 is configured to couple the BL select bias voltage to a target BL.

Sense circuitry 122 is configured to detect presence or absence of a snap back event during a sense interval, e.g., during a read operation. Sense circuitry 122 is configured to provide a logic level output related to the result of the read operation to, e.g., memory controller 110. For example, a logic level corresponding to a logic one may be output if a snap back is detected and a logic level corresponding to a logic zero may be output if a snap back is not detected.

For example, in response to a signal from memory controller logic 110, WL control logic 114 and BL control logic 116 may be configured to select a target memory cell, e.g. memory cell 107, for a read operation by coupling WL 115a to WL select bias voltage and BL 117a to BL select bias voltage. Sense circuitry 126 may then be configured to monitor WL 115a and/or BL 117a for a sensing interval in order to determine whether or not a snap back event occurs. If sense circuitry 126 detects a snap back event, then memory cell 107 may be in the set state. If sense circuitry 126 does not detect a snap back event in the sensing interval, then memory cell 107 may be in the reset state.

Thus, WL control logic 114 and/or BL control logic 116 may be configured to select a target memory cell for a read operation, initiate the read operation, monitor the selected memory cell for a snap back event in a sensing interval and provide the result of the sensing to, e.g., memory controller logic 110

Figure 2A:
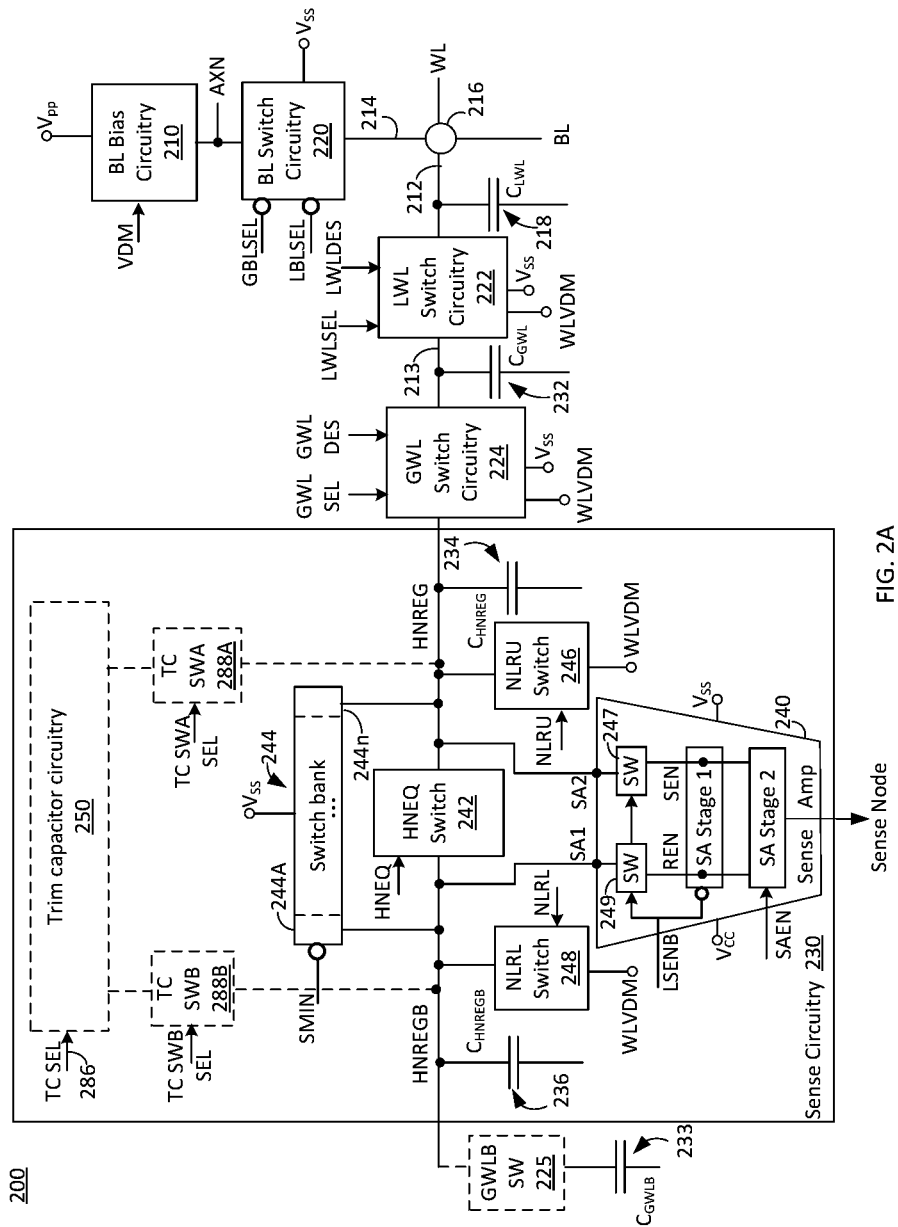
FIG. 2A illustrates a portion of a cross-point memory system consistent with various embodiment of the present disclosure.

FIG. 2A illustrates a portion 200 of a cross-point memory system consistent with various embodiments of the present disclosure. The portion 200 includes a BL and a WL that cross at a memory cell 216. The portion 200 further includes BL bias circuitry 210, BL switch circuitry 220, local WL (LWL) switch circuitry 222, global WL (GWL) switch circuitry 224 and sense circuitry 230. In some embodiments, the portion 200 may include a GWLB switch 225, configured to represent an adjacent portion of the memory array. For example, BL bias circuitry 210 and BL switch circuitry 220 may be included in BL control logic 116 and LWL switch circuitry 222, GWL switch circuitry 224 and GWLB switch 225 may be included in WL control logic 114. Sense circuitry 230 is an example of sense circuitry 122 of FIG. 1.

BL bias circuitry 210 is coupled to a voltage supply Vpp and to BL switch circuitry 220. BL switch circuitry 220 is further coupled to the memory cell 216 by local BL 214. LWL switch circuitry 222 is coupled to memory cell 216 by LWL 212 and to GWL switch circuitry 224 by GWL 213. GWL switch circuitry 224 is further coupled to sense circuitry 230. The LWL switch circuitry 222 is configured to select a LWL, e.g., LWL 212, and couple the selected LWL 212 to the GWL circuitry 224. GWL switch circuitry 224 is configured to couple a selected a LWL, e.g., LWL 212, and the GWL 213 to sense circuitry 230 during, e.g., a memory cell read operation.

The portion 200 further includes a plurality of control inputs. For example, VDM acts as a control signal input to BL bias circuitry 210. For example, VDM may have a nominal value of 4.0 volts. When VDM is increased above a threshold, an output AXN of BL bias circuitry 210 may become BLVDM, that is related to VDM as BLVDM~VDM−VTn where VTn is a threshold voltage of a switch controlled by VDM and included in BL bias circuitry 210. In another example, GBLSEL is a GBL (global BL) select signal. GBLSEL is active low meaning that a GBL coupled to BL switch circuitry 220 is selected when GBLSEL is low and is not selected when GBLSEL is high. "Low" and "high" in this context refer to logic levels and may be related to voltage, e.g., low may correspond to ground (e.g., $V_{SS}$) and high may correspond to a non-zero positive voltage (e.g., $V_{CC}$=1.2 volts). LBLSEL is an LBL (local BL) select signal and is active low. When both GBLSEL and LBLSEL are low, LBL 214 is coupled to AXN. LWLSEL (local WL select) is configured to control coupling LWL 212 to GWL 213 and GWLSEL is configured to control coupling GWL 213 to sense circuitry 230. In some embodiments, GWL switch circuitry 224 and LWL switch circuitry 222 may include deselect circuitry configured to couple GWL 213 and/or LWL 212 to $V_{SS}$ when not selected. In these embodiments, GWLDES and LWLDES are configured to control coupling GWL 213 and LWL 212, respectively, to $V_{SS}$.

The portion 200 includes an LWL inherent capacitance 218 with capacitance value $C_{LWL}$ coupled to LWL 212, and a GWL inherent capacitance 232 with capacitance value $C_{GWL}$, coupled to GWL 213. Inherent capacitances 218, 232 correspond to inherent capacitances associated with LWL 212 and GWL 213, respectively. As used herein, inherent capacitance is capacitance that exists in the circuitry (e.g., conductive path and/or switches) rather than capacitance associated with a capacitor (i.e., a discrete element) that may be added to a circuit. Thus, although capacitances 218 and 232 are shown coupled to LWL 212 and GWL 213, respectively, capacitances 218 and 232 are not discrete elements. Capacitance 218 corresponds to the inherent capacitance of the LWL 212 and capacitance 232 corresponds to the inherent capacitance of the GWL 213.

In the embodiments that include GWLB switch 225, portion 200 may also include GWLB inherent capacitance 233 with capacitance value $C_{GWLB}$. Capacitance 233 is configured to represent capacitance associated with a GWL included in another portion of the memory array that may share (e.g., multiplex) sense circuitry 230. Capacitance 233 may be selected by GWLB switch 225. In these embodiments, capacitance 233 may be utilized as an adjustment capacitance to adjust a reference voltage for sense circuitry 230 that is based, at least in part, on inherent capacitances 232, 234, 236, as described herein. Utilizing capacitance 233 as an adjustment capacitance may improve noise rejection by providing a relatively better matched noise component that may then be eliminated by, e.g., a sense amplifier.

Sense circuitry 230 includes sense amplifier 240, HNEQ switch 242, bank of switches 244A, . . . , 244n, collectively, switch bank 244, NLRU switch 246 and NLRL switch 248. Sense circuitry 230 includes a first sense circuitry capacitance 234 with capacitance $C_{HNREG}$ and a second sense circuitry capacitance 236 with capacitance $C_{HNREGB}$. Capacitances 234, 236 represent the inherent capacitance of the circuitry between GWL switch circuitry 224 and no limit read-upper (NLRU) switch 246 and between GWLB SW 225 and no limit read-lower (NLRL) switch 248, respectively. Here, upper and lower refer to portions of memory array, e.g., memory array 106 of FIG. 1.

In some embodiments, sense circuitry 230 may include trim capacitor circuitry 250 and trim capacitor switches TC SWA 288A and TC SWB 288B. TC SWA 288A is configured to couple the trim capacitor circuitry 250 to node HNREG. TC SWB 288B is configured to couple the trim capacitor circuitry 250 node HNREGB. The switches 288A, 288B are configured to facilitate use of the trim capacitor circuitry 250 with more than one portion of memory array 106. For example, TC SWA 288A may be open and TC SWB 288B may be closed to couple the trim capacitor circuitry 250 to HNREGB to adjust the capacitance coupled to HNREGB, as described herein. In this first example, memory cell 216 may be selected for a memory access operation. In another example, TC SWA 288A may be closed and TC SWB 288B may be open to couple the trim capacitor circuitry 250 to HNREG to adjust the capacitance coupled to HNREG. In this second example, a memory cell in an adjacent memory portion may be selected for a memory access operation. In other words, the trim capacitor circuitry 250 may be coupled to node HNREGB or node HNREG but not both. The trim capacitor circuitry 250 may then be utilized to adjust $V_{REF}$, as described herein. Sharing the trim capacitor circuitry 250 is configured to conserve die area.

The sense amplifier 240 includes two inputs with a first input SA1 coupled to node HNREGB and a second input SA2 coupled to node HNREG. HNEQ switch 242 is coupled between nodes HNREGB and HNREG. Switch bank 244 includes a plurality of switches 244A, . . . , 244n configured to individually couple and decouple node HNREG and/or HNREGB to or from $V_{SS}$. The switches 244A, . . . , 244n are controlled by control signal SMIN. SMIN is active low, thus switches 244A, . . . , 244n are closed when SMIN is low and open when SMIN is high. NLRU switch 246 is coupled between supply voltage WLVDM and node HNREG and NLRL switch 248 is coupled between supply voltage WLVDM and node HNREGB. For example, WLVDM may have a nominal value of −3.6 volts. First sense circuitry capacitance 234 is coupled to node HNREG and second sense circuitry capacitance 236 is coupled to node HNREGB. GWL switch circuitry 224 is coupled to node HNREG and GWLB SW 225 may be coupled to node HNREGB. Trim capacitor circuitry 250 may be coupled to node HNREG by TC SWA 288A or to node HNREGB by TC SWB 288B, as described herein.

HNEQ switch 242 has as control input HNEQ and is configured to couple or decouple node HNREG to/from node HNREGB. NLRU switch 246 and NLRL switch 248 each have a respective control input: NLRU and NLRL. NLRU switch 246 is configured to couple node HNREG to WLVDM and NLRL switch 248 is configured to couple node HNREGB to WLVDM.

Sense amplifier 240 may include two switches 247, 249, a first stage SA Stage 1 and a second stage SA Stage 2. Sense amplifier 240 is coupled to at least one voltage supply, $V_{CC}$ (logic level supply), and may be coupled to $V_{SS}$, i.e., ground. Sense amplifier 240 further includes two control inputs, LSENB and SAEN. Switch 247 is configured to couple node SA2, and thereby node HNREG, to SEN, an input to SA Stage 1. Switch 249 is configured to couple node SA1, and thereby node HNREGB, to REN, another input to SA Stage 1. In some embodiments, nodes REN and SEN may also be coupled to inputs to SA Stage 2. Switches 247, 249 are active high switches controlled by LSENB, thus, when LSENB is high, HNREGB is coupled to REN and HNREG is coupled to SEN. LSENB is further coupled to SA Stage 1 and is an active low signal configured to enable SA Stage 1. Thus, SA Stage 1 is enabled when LSENB is low and disabled when LSENB is high, as described herein. SAEN is configured to enable SA Stage 2. In operation, when SA Stage 2 is enabled, a memory read output may be provided to the sense node.

Sense amplifier 240 may include any type of sense amplifier configured to receive negative input voltages (e.g., reference voltage and sense voltage) and to generate a logic level voltage output while avoiding short circuit current between logic level supplies (e.g., $V_{CC}$ and $V_{SS}$) during transitions. Such a sense amplifier may be configured to level shift the negative input voltages to positive-referenced intermediate voltages. Respective values of the intermediate voltages may be based, at least in part, on relative values of the negative input voltages. Such a sense amplifier may be further configured to convert the intermediate voltages to a logic level voltage output based, at least in part, on relative values of the intermediate voltages. Such a sense amplifier may have a relatively small input offset voltage and is configured to provide relatively low energy, relatively high speed level shifting to produce a logic level output from a relatively low level input.

Figure 2B:
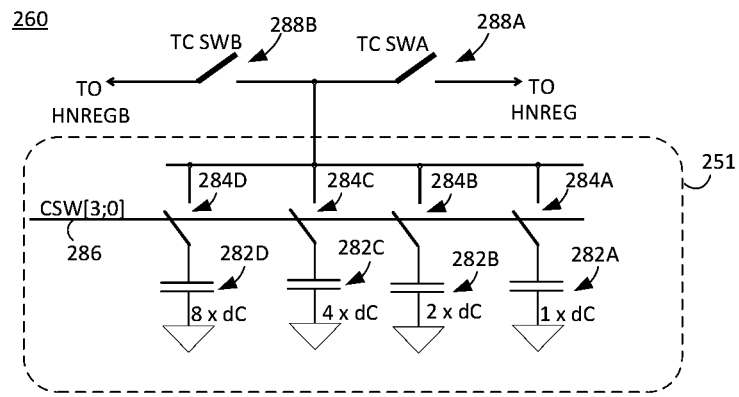
FIG. 2B illustrates example binary weighted trim capacitor circuitry consistent with one embodiment of the present disclosure.

FIG. 2B illustrates an example circuit portion 260 including a binary weighted trim capacitor 251 consistent with one embodiment of the present disclosure. Binary weighted trim capacitor 251 is one example of trim capacitor circuitry 250 of FIG. 2A. The binary weighted trim capacitor 251 includes a plurality (e.g., four) of trim capacitors 282A, . . . , 282D. Each trim capacitor 282A, . . . , 282D has a capacitance value that is a power of two multiplied by a nominal capacitance value, dC. In a non-limiting example, the capacitance value of dC may be on the order of 10 femtofarads (fF). For example, first trim capacitor 282A has a capacitance value of one (i.e., $2^0$) times dC, second trim capacitor 282B has a capacitance value of two (i.e., $2^1$) times dC, third trim capacitor 282C has a capacitance value of four (i.e., $2^2$) times dC and fourth trim capacitor 282D has a capacitance value of eight (i.e., $2^3$) times dC. The binary weighted trim capacitor 251 further includes a plurality of switches 284A, . . . , 284D. The number of switches corresponds to the number of trim capacitors 282A, . . . , 282D. A state of each switch 284A, . . . , 284D is configured to be controlled by a selector 286. When a respective switch 284A, . . . , 284D is closed, the associated trim capacitor 282A, . . . , 282D is coupled to switches 288A, 288B and thereby to HNREG or HNREGB. Thus, based on a selector value (four bits in the example), none, one or more of switches 284A, . . . , 284D may be closed. The binary weighted trim capacitor 251 may then provide a selectable trim capacitance value in the range zero (i.e., all switches 284A, . . . , 284D open) to 15*dC (i.e., all switches 284A, . . . , 284D closed) in gradations of dC. Thus, based, at least in part, on capacitance values of inherent capacitances 218, 232, 234 and 236 and the selected capacitance value of binary weighted trim capacitor 251, a selected reference voltage may be produced at one or more of nodes HNREG and HNREGB, as described herein.

Figure 2C:
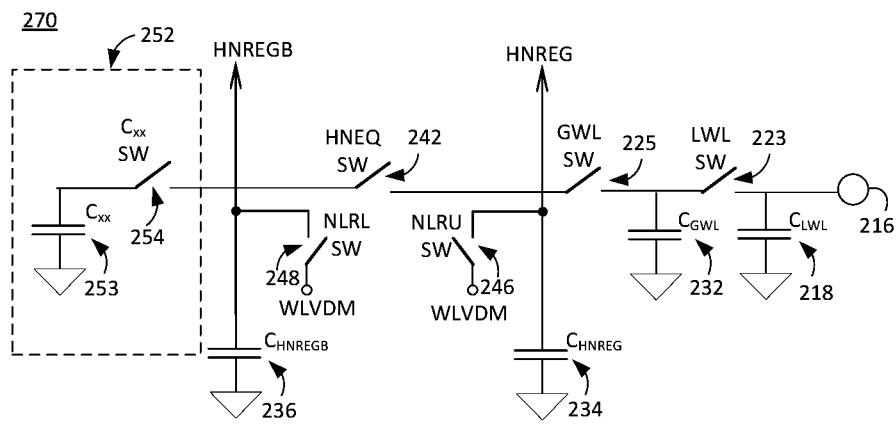
FIG. 2C is a simplified sketch illustrating inherent capacitances and a reference voltage adjustment capacitance consistent with various embodiments of the present disclosure.

FIG. 2C is a simplified sketch 270 illustrating the inherent capacitances and reference voltage adjustment capacitor circuitry 252 associated with local reference voltage production, as described herein. Reference voltage adjustment capacitor circuitry 252 includes an adjustment capacitor 253 and adjustment capacitor switch 254. In an embodiment, circuitry 252 may correspond to trim capacitor circuitry 250. In this example, $C_{xx}$ SW 254 corresponds to TC SWB 288B, TC SWA 288A is open decoupling the trim capacitor circuitry 250 from node HNREG and $C_{xx}$ 253 corresponds to the capacitance of trim capacitor circuitry 250. In another embodiment circuitry 252 may correspond to GWLB SW225 and inherent capacitance 233. In this embodiment, $C_{xx}$ switch 254 corresponds to GWLB SW 225 and capacitance 253 corresponds to capacitance 233. Thus, $C_{xx}$ corresponds to $C_{GWLB}$ in this embodiment.

The inherent capacitances 218, 232, 234, 236 and adjustment capacitance 253 may be configured to be generally in parallel. Coupling of the capacitances 218, 232, 234, 236, 253 may then be controlled by HNEQ switch 242, a LWL switch 223, a GWL switch 225 and $C_{xx}$ switch 254. LWL switch 223 and GWL 225 switch may be included in LWL switch circuitry 222 and GWL switch circuitry 224, respectively. Generally, in operation, capacitances 218, 232, 234, 236, 253 may be utilized to store charge related to a reference voltage for sense amplifier 240. HNEQ switch 242 is configured to couple and decouple nodes HNREG and HNREGB, as described herein. Coupling adjustment capacitance 253 in parallel with inherent capacitance 236 is configured to provide a desired reference voltage related to WLVDM.

Generally, a charge Q on a capacitive element with capacitance C, is equal to a product of the capacitance and the potential difference (i.e., voltage) across the capacitive element (Q=C*V). As used herein, "capacitive element" includes, e.g., a capacitor, an inherent capacitance and/or a parallel combination of one or more thereof. If a plurality of capacitive elements, one or more with an initial charge and corresponding initial voltage, are then coupled in parallel, the initial voltages will equalize to a final voltage. Based on conservation of charge, a total charge before equalizing equals a total charge after equalizing. For example, consider two capacitive elements with capacitance $C_1$ and $C_2$ and respective initial voltages of $V_1$ and $V_2$. The initial charge is $$Q_i = Q_1 + Q_2 = C_1 * V_1 + C_2 * V_2.$$

If the capacitors are then coupled in parallel, the final charge is $$Q_f = V_f * (C_1 + C_2)$$

where $V_f$ is the final voltage across the capacitive elements coupled in parallel. Since $Q_i = Q_f$, $$C_1 * V_1 + C_2 * V_2 = V_f * (C_1 + C_2).$$

Thus, $$V_f = \frac{C_1}{C_1 + C_2} V_1 + \frac{C_2}{C_1 + C_2} V_2$$

Based on charge conservation and utilizing inherent capacitances charged by bias voltages, a reference voltage may be locally produced, as described herein.

Figure 3A:
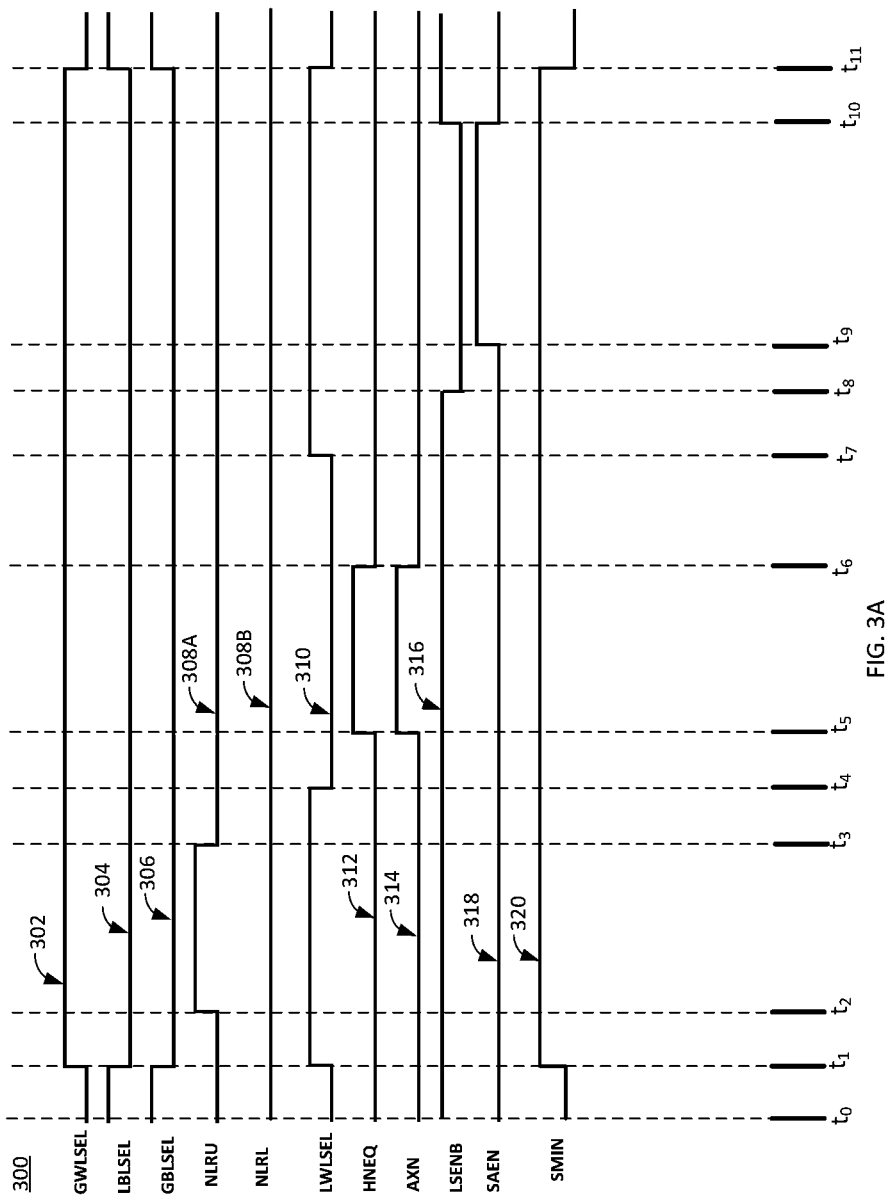
FIG. 3A is a timing diagram that illustrates example memory read operations of the cross-point memory system of FIG. 2A.

FIG. 3A is a timing diagram 300 that illustrates example memory read operations of cross-point memory system 200.

Figure 3B:
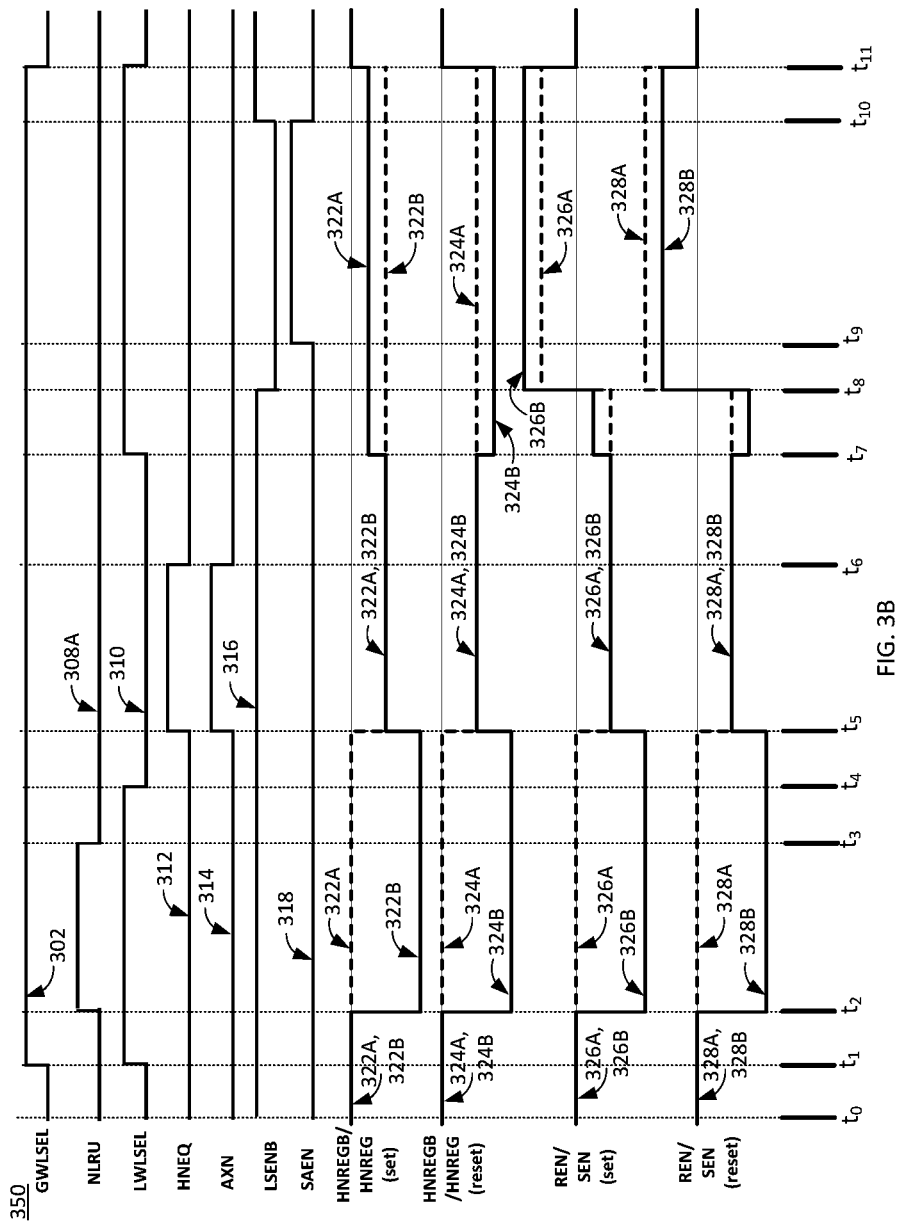
FIG. 3B is a timing diagram that illustrates example sense and reference voltages and input voltages to a sense amplifier for set and reset memory cells for memory read operations of the cross-point memory system of FIG. 2A.

FIG. 3B is a timing diagram 350 that illustrates example voltages at nodes HNREG and HNREGB including sense and reference voltages and input voltages (REN, SEN) to a sense amplifier for set and reset memory cells for memory read operations of cross-point memory system 200. Timing diagrams 300, 350 may be best understood when read with attention also to the cross-point memory portion 200 illustrated in FIG. 2A and simplified portion 270 illustrated in FIG. 2C.

Timing diagram 300 includes waveform 302 that corresponds to control input GWLSEL, waveform 304 that corresponds to control input LBLSEL, waveform 306 that corresponds to control input GBLSEL, waveform 308A that corresponds to control input NLRU, a control input for NLRU switch 246 and waveform 308B that corresponds to control input NLRL, a control input for NLRL switch 248. Timing diagram 300 further includes waveform 310 that corresponds to control input LWLSEL, waveform 312 that corresponds to control input HNEQ, waveform 314 that corresponds to BL bias voltage circuitry 210 output AXN, waveform 316 that corresponds to control input LSENB configured to enable a first stage of sense amplifier 240, waveform 318 that corresponds to control input SAEN configured to enable an output of sense amplifier 240 and waveform 320 that corresponds to control input SMIN, as described herein.

Timing diagram 350 includes waveform 322A that corresponds to a voltage detected at node HNREGB (and may correspond to a reference voltage $V_{REF}$) and waveform 322B that corresponds to a voltage detected at node HNREG (and may correspond to a sense voltage $V_{SENSE}$). Waveforms 322A and 322B correspond to voltages at HNREGB and HNREG for a memory cell, e.g., memory cell 216, in a set state. Timing diagram 350 further includes waveform 324A that is similar to waveform 322A and waveform 324B that is similar to waveform 322B, except waveforms 324A and 324B correspond to a memory cell, e.g., memory cell 216, in a reset state.

Timing diagram 350 further includes waveform 326A that corresponds to a first input voltage REN to a first stage of sense amplifier 240 and waveform 326B that corresponds to a second input voltage SEN to a first stage of sense amplifier 240, as described herein. Waveforms 326A and 326B correspond to REN and SEN for a memory cell, e.g., memory cell 216, in a set state. Timing diagram 350 further includes waveform 328A that corresponds to a first input voltage REN to a first stage of sense amplifier 240 and waveform 328B that corresponds to a second input voltage SEN to a first stage of sense amplifier 240, as described herein. Waveforms 328A and 328B correspond to REN and SEN for a memory cell, e.g., memory cell 216, in a reset state.

Initially, at time $t_0$, GWLSEL and LWLSEL are low and LBLSEL and GBLSEL are high indicating that the associated GWL, LWL, GBL, LBL are not selected. NLRU is low indicating that node HNREG is not coupled to WLVDM. Similarly, NLRL is low indicating that HNREGB is not coupled to WLVDM. NLRL remains low for the time period $t_0$ through at least $t_{11}$. NLRL may be utilized for memory read operations for an adjacent memory array portion, similar to NRLU, thus, waveform 308B may correspond to waveform 308A for memory read operations of the adjacent memory portion. HNEQ is low indicating that node HNREG is not coupled to node HNREGB. AXN is low indicating that VDM is also low, LSENB is high indicating that HNREGB is coupled to REN, HNREG is coupled to SEN and SA Stage 1 is not enabled. SAEN is low indicating that sense amplifier 240 output (i.e., SA Stage 2) is not enabled. SMIN is low indicating that HNREG and HNREGB are coupled to $V_{SS}$ by switches 244A, . . . , 244n. Thus, at time $t_0$, charges on inherent capacitances 218, 232, 234 and 236 and adjustment capacitance 253 are zero and the voltage at HNREGB, the voltage at node HNREG, REN and SEN are also zero (i.e., $V_{SS}$).

At time $t_1$, GWLSEL, LBLSEL, GBLSEL and LWLSEL change state, selecting GWL 213, LWL 212, LBL 214 and associated GBL and thereby coupling memory cell 216 to BL bias circuitry 210 and to sense circuitry 230. SMIN switches high opening switches 244A and 244n and decoupling nodes HNREG and HNREGB from $V_{SS}$. Thus, at time $t_1$, LWL switch 223 and GWL switch 225 close, coupling inherent capacitances 218 and 232 to node HNREG. The voltages at nodes HNREGB and HNREG, REN and SEN remain at zero.

At time $t_2$, NLRU switch 246 closes, coupling HNREG to WLVDM. Thus, at time $t_2$, when NLRU switch 246 closes, inherent capacitances 218, 232 and 234 become coupled to WLVDM and begin to charge to WLVDM. Node HNREG begins to transition to WLVDM and node HNREGB remains at $V_{SS}$.

At time $t_3$, NLRU switch 246 opens, decoupling inherent capacitances 218, 232 and 234 from WLVDM. The time period from $t_2$ to $t_3$ represents a precharge time period. Inherent capacitances 218, 232 and 234 are charged to WLVDM during the precharge time period. At time $t_3$, HNREGB remains at $V_{SS}$ and HNREG (i.e., $C_{HNREG}$), GWL 213 (i.e., $C_{GWL}$) and LWL 212 (i.e., $C_{LWL}$) are at WLVDM. At time $t_4$, in response to LWLSEL changing state, LWL switch circuitry 222 decouples LWL 212 from GWL 213 thereby floating LWL 212. LWL 212 remains charged to WLVDM.

At time $t_5$, HNEQ switch 242 closes coupling node HNREGB to HNREG and SA1 to SA2. Also at time $t_5$, VDM is applied to BL bias circuitry 210, raising AXN from $V_{SS}$ to BLVDM. Time $t_5$ corresponds to a start of sensing interval of the state of memory cell 216 and also production of a reference voltage $V_{REF}$ for sense amplifier 240. Advantageously, the reference voltage $V_{REF}$ may be produced locally from GWL and LWL bias voltages and in a time period that corresponds to the sensing interval. In other words, $V_{REF}$ may be understood as an incidental byproduct of charging the LWL 212. Thus, generating the reference voltage remotely and transferring the remotely generated reference voltage to the sense amplifier 240 may be avoided and without increasing a sensing interval duration. An additional advantage to coupling HNREGB and HNREG is that noise present on, e.g., GWL, HNREG, HNREG and/or GWLB (if utilized for adjustment capacitance) may become common mode. Thus, the sense amplifier 240 may reduce or eliminate the common mode noise resulting in a relatively improved noise immunity and robustness.

Just prior to HNEQ switch 242 closing, i.e., just prior to time $t_5$, inherent capacitance 236 ($C_{HNREGB}$) and adjustment capacitance 253 ($C_{xx}$) are configured to have zero charge and inherent capacitances 232 and 234 are configured to have stored charge:

$$Q_{GWL} = C_{GWL} * WLVDM$$

and $$Q_{HNREG} = C_{HNREG} * WLVDM,$$

respectively.

Thus, just prior to HNEQ switch 242 closing, initial charge $Q_i$ is:

$$Q_i = Q_{xx} + Q_{HNREGB} + Q_{GWL} + Q_{HNREG}$$

If capacitances 236 and 253 have zero charge, then $Q_i$ is:

$$Q_i = (C_{xx} * 0) + (C_{HNREGB} * 0) + (C_{GWL} * WLVDM) + (C_{HNREG} * WLVDM) = (C_{GWL} + C_{HNREG}) * WLVDM.$$

After HNEQ switch 242 closes, charge may transfer from capacitances 232 and 234 to capacitances 236 and 253. At steady state, since capacitances 232, 234, 236 and 253 are coupled in parallel, $$Q_f = (C_{GWL} + C_{HNREG} + C_{HNREGB} + C_{xx})V_f$$

where $Q_f$ is total final charge and $V_f$ is final voltage across the capacitances 232, 234, 236, 253. It should be noted that LWL capacitance 218 is not included in this calculation since LWL switch 223 is open so that LWL 212 is decoupled from at least GWL 213 and sense circuitry 230. Based on conservation of charge (i.e., $Q_i = Q_f$), $$(C_{GWL} + C_{HNREG}) \cdot WLVDM = (C_{GWL} + C_{HNREG} + C_{HNREGB} + C_{xx})V_f$$

which may be written as:

$$V_{REF} = V_f = \frac{C_{GWL} + C_{HNREG}}{C_{GWL} + C_{HNREG} + C_{HNREGB} + C_{xx}} \cdot WLVDM$$

where $V_f$ corresponds to the reference voltage $V_{REF}$, as described herein. Advantageously, consistent with the present disclosure, $V_{REF}$ may be produced utilizing local bias voltage WLVDM and charge stored in inherent capacitances (i.e., GWL capacitance $C_{GWL}$ and first sense circuitry capacitance $C_{HNREG}$) when the bias voltage WLVDM is applied to the GWL 213 via node HNREG.

BLVDM is approximately equal to VDM less a threshold voltage (e.g., VTn) of a switch associated with BL bias circuitry 210. Thus, LWL 212 that was charged to WLVDM and LBL 214 that is now charged to BLVDM provide a differential voltage across memory cell 216 corresponding to BLVDM+|WLVDM|. In other words, since WLVDM is typically negative and BLVDM is typically positive, the net potential difference across the memory cell 216 is the sum of the absolute values of BLVDM and WLVDM. Thus, memory cell 216 may snap back (set) or may not snap back (reset) during time interval $t_5$ to $t_6$, depending on whether the memory cell is storing a zero (reset) or a one (set). Charge on LWL 212 may then reflect the state of the memory. For example, if the threshold voltage of memory cell 216 is greater than BLVDM+|WLVDM|, no snap back may occur corresponding to a logic zero stored. If snap back does not occur, $V_{LWL}$ on LWL 212 may remain at or near WLVDM. In another example, if the threshold voltage of memory cell 216 is less than or equal to BLVDM+|WLVDM|, snap back may occur corresponding to a logic one stored. If snap back occurs, the voltage ($V_{LWL}$) on LWL 212 may increase to greater than WLVDM, i.e., $|V_{LWL}| < |WLVDM|$ as current flows through the memory cell. In other words, $V_{LWL}$ may correspond to WLVDM if no snap back occurs and $V_{LWL}$ may increase to near zero if snap back occurs.

Concurrently with sensing, when HNEQ switch 242 is closed, node HNREG is coupled to node HNREGB. Just prior to HNEQ switch closing (i.e., $t_{5minus}$), node HNREGB is at $V_{SS}$ and node HNREG is at WLVDM. Thus, inherent capacitances 234 and 232 are charged to WLVDM and inherent capacitance 236 and adjustment capacitance 253 are at $V_{SS}$. After HNEQ switch 242 closes, HNREGB and HNREG may equalize to a value between $V_{SS}$ and WLVDM.

Thus, just prior to time $t_6$, voltages at HNREGB, HNREG and GWL 213 may be at or near $V_{REF}$ and LWL 212 may have a charge corresponding to a voltage $V_{LWL}$ (i.e., a detected memory cell voltage). At time $t_6$, HNEQ switch 242 may open, decoupling HNREGB and HNREG. Also at time $t_6$, BL bias circuitry 210 may be decoupled from $V_{PP}$, thus AXN may return to $V_{SS}$. Both HNREGB and HNREG may remain at $V_{REF}$ and GWL 213 may similarly be at $V_{REF}$.

At time $t_7$, LWL 212 may again be selected and LWL switch circuitry 222 may couple LWL 212 to GWL 213 (i.e., $C_{GWL}$) and thereby to node HNREG. $V_{LWL}$ from LWL 212 may then combine with $V_{REF}$ at node HNREG to yield a voltage $V_{SENSE}$ at HNREG configured to indicate a state of memory cell 216.

Prior to time $t_7$, HNEQ switch is open thus node HNREGB is decoupled from node HNREG. From the equalization that occurred between time $t_5$ and $t_6$, both node HNREGB and node HNREG are at $V_{REF}$. Thus, just prior to time $t_7$, an initial charge on the inherent capacitances 232 and 234, coupled to node HNREG is:

$$Q_i = (C_{HNREG} + C_{GWL}) \cdot V_{REF}.$$

Similarly, the initial charge associated with LWL 212 is $C_{LWL} \cdot V_{LWL}$ where $V_{LWL}$ corresponds to a detected memory cell voltage that may be at or near WLVDM or a voltage related to WLVDM and BLVDM, e.g., zero volts. Based again on conservation of charge:

$$(C_{HNREG} + C_{GWL}) \cdot V_{REF} + C_{LWL}V_{LWL} = (C_{HNREG} + C_{GWL} + C_{LWL}) \cdot V_{SENSE}$$

where $V_{SENSE}$ corresponds to a voltage at node HNREG that results from recoupling LWL 212 with GWL 213 and node HNREG after a sensing interval. Thus, $$V_{SENSE} = \frac{C_{HNREG} + C_{GWL}}{C_{HNREG} + C_{GWL} + C_{LWL}} V_{REF} + \frac{C_{LWL}}{C_{HNREG} + C_{GWL} + C_{LWL}} V_{LWL}$$

During the time interval $t_7$ to $t_8$, HNREGB may be at $V_{REF}$ and node HNREG may be at $V_{SENSE}$. Thus, waveform 322A corresponds to $V_{SENSE}$ and waveform 322B corresponds to $V_{REF}$ for a memory cell in the set state and waveform 324A corresponds to $V_{SENSE}$ and waveform 324B corresponds to $V_{REF}$ for a memory cell in the reset state during the time interval beginning with time $t_7$. $V_{REF}$ is applied to input SA1 and $V_{SENSE}$ is applied to input SA2 of sense amplifier 240. Since LSENB remains high in the time interval $t_7$ to $t_8$, SA1 is coupled to REN and SA2 is coupled to SEN, thus REN is at $V_{REF}$ and SEN is at $V_{SENSE}$. Whether a difference between $V_{SENSE}$ and $V_{REF}$ is positive or negative (i.e., $V_{SENSE} > V_{REF}$ or $V_{SENSE} < V_{REF}$) may then indicate whether or not a snap back occurred and thereby whether memory cell 216 stores a zero or a one. If $V_{SENSE}$ is greater than $V_{REF}$, sense amplifier 240 is configured to output a logic one to the sense node. If $V_{SENSE}$ is less than $V_{REF}$, sense amplifier 240 is configured to output a logic zero to the sense node.

A difference between $V_{SENSE}$ and $V_{REF}$ may be determined as $$\Delta V = V_{SENSE} - V_{REF} = \frac{C_{HNREG} + C_{GWL}}{C_{HNREG} + C_{GWL} + C_{LWL}} V_{REF} + \frac{C_{LWL}}{C_{HNREG} + C_{GWL} + C_{LWL}} V_{LWL} - V_{REF}$$

which, after some algebraic manipulation simplifies to $$\Delta V = \frac{C_{LWL}}{C_{HNREG} + C_{GWL} + C_{LWL}} (V_{LWL} - V_{REF})$$

Since $V_{LWL}$ may correspond to WLVDM in the absence of snap back and may be at or near zero if there is snap back, it may be desirable for $V_{REF}$ to be at or near WLVDM/2. $V_{REF}$ may be at or near WLVDM/2 if $$C_{GWL} + C_{HNREG} = C_{HNREGB} + C_{xx}$$

Thus, selection of $C_{xx}$ may be based, at least in part, on the values of $C_{GWL}$, $C_{HNREG}$ and $C_{HNREGB}$.

In some embodiments, $C_{xx}$ may be selected so that $V_{REF}$ is not equal to WLVDM/2. For example, adjusting $V_{REF}$ to greater than or less than WLVDM/2 may be configured to accommodate variation in memory cell threshold voltage thereby providing a more reliable sensing of the state of the memory cell. In other words, adjusting $V_{REF}$ may be configured to optimize sensing the state of the memory cell.

At time $t_8$, LSENB is switched low, decoupling SA1 from REN and SA2 from SEN and enabling SA Stage 1 to generate intermediate positive-reference voltages based, at least in part, on REN (i.e., $V_{REF}$) and SEN (i.e., $V_{SENSE}$). The voltages on nodes SEN and REN (that were at or below zero prior to time $t_8$) are configured to ramp up to the intermediate voltages, $V_{CC}$ or $V_{CC} - |V_{TP}|$. Whether node SEN is at $V_{CC}$ or $V_{CC} - |V_{TP}|$ depends on whether $V_{SENSE}$ was greater than or less than $V_{REF}$. For example, if $V_{SENSE}$ is greater than $V_{REF}$ (i.e. is less negative than $V_{REF}$), node SEN may reach $V_{CC}$ (waveform 326B) and node REN may then become $V_{CC} - |V_{TP}|$ (waveform 326A), where $V_{TP}$ corresponds to the threshold voltage of a transistor included in SA Stage 1. In another example, if $V_{SENSE}$ is less than $V_{REF}$ (i.e., $V_{SENSE}$ is more negative than $V_{REF}$), node REN may reach $V_{CC}$ (waveform 328A) and node SEN may then become $V_{CC} - |V_{TP}|$ (waveform 328B). SA Stage 1 may be configured to generate intermediate output voltages at nodes SEN and REN that correspond to $V_{CC}$ and $V_{CC} - |V_{TP}|$ when nodes REN and SEN are decoupled from SA1 and SA2, respectively. Negative input voltages may be level-shifted to $V_{CC}$ (e.g., positive, logic-level voltage) referenced intermediate voltages by, e.g., SA Stage 1. SA Stage 1 may be configured to provide the level-shifting with a relatively small input offset voltage, zero static current between supplies and relatively low energy consumption.

At time $t_9$, SAEN is switched high to enable SA Stage 2. The time period $t_8$ to $t_9$ is configured to allow the intermediate voltages to settle to steady state. For example, during the time interval $t_8$ to $t_9$, a respective $V_{CC}$ and $V_{CC} - |V_{TP}|$ may reach steady state on SEN and REN. At time $t_9$, SA Stage 2 is configured to convert the intermediate voltages to a logic level voltage output based, at least in part, on relative values of the intermediate voltages and to provide the logic level output to sense node. For example, SA Stage 2 may be coupled to SEN and REN. Thus, at time $t_9$, SAEN switches high thereby providing an output of the sense amplifier to the sense node. If $V_{SENSE}$ is greater than $V_{REF}$, then the output may correspond to $V_{CC}$. If $V_{SENSE}$ is less than $V_{REF}$, then the output may correspond to $V_{SS}$. At time period $t_{10}$, data corresponding to a state of memory element 216, e.g., voltage(s) corresponding to a logic zero and/or a logic one are output from the sense amplifier 240 to the sense node. At time $t_{10}$, sense amplifier 240 may be disabled. The read operation may end at time $t_{11}$.

Thus, sense amplifier 240 is configured to receive $V_{SENSE}$ and $V_{REF}$ and to provide a logic level output based, at least in part, on whether $V_{SENSE}$ is greater than or less than $V_{REF}$. SA Stage 1 is configured to level shift $V_{SENSE}$ and $V_{REF}$ to respective intermediate voltages referenced to $V_{CC}$. SA Stage 2 is configured to convert the intermediate voltages into a logic level (e.g., $V_{SS}$ or $V_{CC}$) output based, at least in part, on relative values of the intermediate voltages and to provide the output to a sense node.

Thus, timing diagrams 300, 350 and memory array portion 200 are configured to illustrate operation of a system for producing a reference voltage locally utilizing, e.g., WL biasing and inherent capacitances. The reference voltage may be adjusted by an adjustment capacitance, e.g., the trim capacitors included in trim capacitor circuitry 250 or the inherent capacitance 233 associated with an adjacent GWLB.

Thus, FIGS. 2A, 2B and 2C illustrate producing a reference voltage by sense circuitry using inherent capacitances. In an embodiment, an adjacent memory portion may be utilized (e.g., GWLB) to provide additional inherent capacitance to produce a reference voltage that is at or near WLVDM/2. In another embodiment, trim capacitor circuitry may provide the adjustment capacitance. The adjustment capacitance may be utilized to adjust $V_{REF}$. $V_{REF}$ may be adjusted to accommodate characteristics of the associated cross-point memory portion. For example, $V_{REF}$ may be adjusted to greater than or less than WLVDM/2 to, e.g., optimize a sense margin between a maximum set voltage and a minimum reset voltage for the memory cell.

Figure 4:
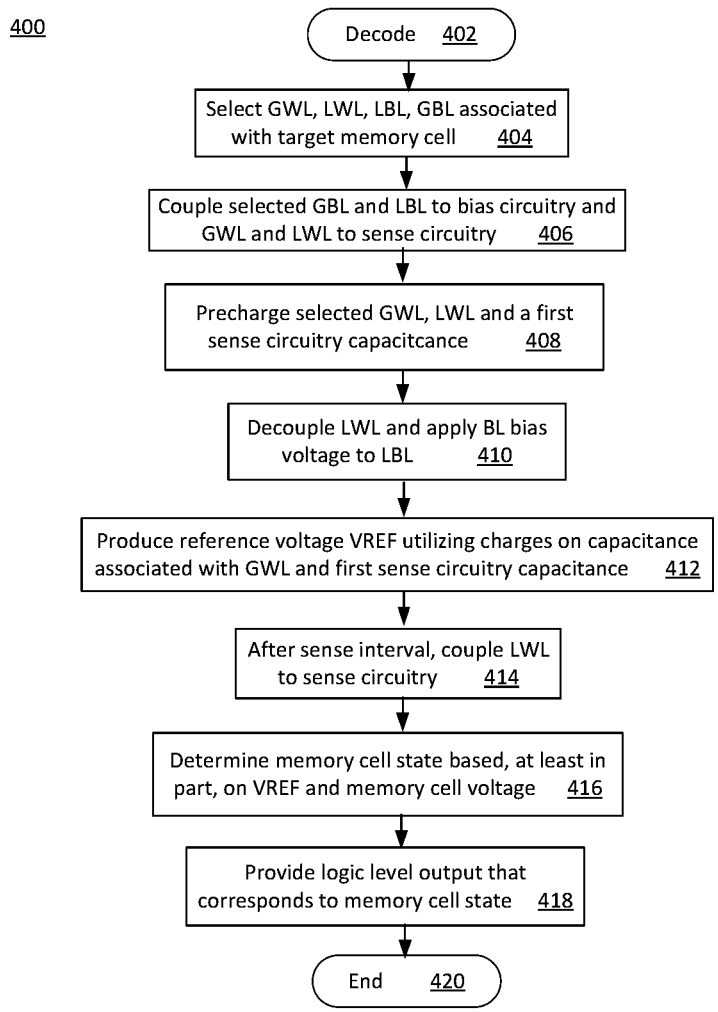
FIG. 4 illustrates a flowchart of operations for producing a reference voltage in a cross-point memory consistent with various embodiments of the present disclosure.

FIG. 4 illustrates a flowchart 400 of operations for a memory access operation including producing a reference voltage in a cross-point memory consistent with various embodiments of the present disclosure. The operations may be performed, for example, by a memory controller, e.g., memory controller 104, including WL control logic 114 and BL control logic 116. Flowchart 400 depicts exemplary operations configured to perform a memory access operation, e.g., a read operation. In particular, flowchart 400 depicts exemplary operations configured to read a memory cell, including producing a reference voltage using inherent capacitances and a bias voltage, as described herein.

Operations of flowchart 400 may begin with decoding a memory address at operation 402. A GWL, a LWL, a GBL and a LBL associated with a target memory cell may be selected based, at least in part, on the decoded memory address at operation 404. Operation 406 may include coupling the selected GBL and LBL to bias circuitry and GWL and LWL to a sense circuitry, e.g., sense circuitry 230 of FIG. 2A. Operation 408 includes precharging the selected GWL, LWL and a first sense circuitry capacitance. For example, the selected GWL, LWL and first sense circuitry capacitance may be precharged to voltage WLVDM.

The LWL may be decoupled from the sense circuitry and a BL bias voltage may be applied to the LBL at operation 410. An applied voltage across the selected memory cell may then correspond to BLVDM minus WLVDM and is configured to be greater than a maximum set voltage and less than a minimum reset voltage for the memory cell. A snapback may increase the voltage on the LWL from WLVDM to a voltage at or near zero and absence of a snapback may not affect the voltage on the LWL, i.e., the LWL voltage may remain at WLVDM. Operation 412 includes producing a reference voltage, $V_{REF}$, utilizing charges on capacitance associated with GWL and the first sense circuitry capacitance. The reference voltage may be based, at least in part, on inherent capacitance associated with the GWL, the first sense circuitry capacitance and a second sense circuitry capacitance and an adjustment capacitance, as described herein. For example, nodes HNREG and HNREGB of sense circuitry 230 may be coupled to equalize the voltages on the capacitances.

After a sense interval, the LWL may be coupled to sense circuitry at operation 414. As a result of operation 414, node HNREG may be charged to $V_{SENSE}$. $V_{SENSE}$ is based, at least in part, on a state of the read memory cell. Operation 416 may include determining the memory cell state based, at least in part, on $V_{REF}$ and the memory cell voltage $V_{LWL}$. Operation 418 may include providing a logic level output that corresponds to the memory cell state. For example, a sense amplifier, e.g., sense amplifier 240, may be configured to receive $V_{SENSE}$ and $V_{REF}$ and to provide a logic level output based, at least in part, on whether $V_{SENSE}$ is greater than or less than $V_{REF}$. Program flow may then end at operation 420.

Thus, the operations of flowchart 400 are configured to produce a reference voltage $V_{REF}$ utilizing inherent capacitances and a WL bias voltage, WLVDM. The operations of flowchart 400 are further configured to apply a bias voltage to the memory cell and detect a selected memory cell voltage. Whether or not snapback has occurred may then be determined based, at least in part, on relative values of a sensed voltage $V_{SENSE}$ that is related to the detected memory cell voltage $V_{LWL}$ and $V_{REF}$.

While FIG. 4 illustrates various operations according one embodiment, it is to be understood that not all of the operations depicted in FIG. 4 are necessary for other embodiments. Indeed, it is fully contemplated herein that in other embodiments of the present disclosure, the operations depicted in FIG. 4 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, this disclosure describes a system and method configured to locally produce a reference voltage for reading memory cells. The system and method are configured to utilize inherent capacitances associated with a local WL and a global WL as well as a first sense circuitry capacitance. A bias voltage applied as part of a memory access operation charges the inherent capacitances. A resulting charge on the inherent capacitances may then be utilized to produce the reference voltage. A value of the reference voltage is based, at least in part, on relative values of the inherent capacitances. In an embodiment, a global WL from an unselected adjacent memory portion may provide an adjustment capacitance configured to adjust the reference voltage, as described herein. In another embodiment, trim capacitor circuitry may provide additional (i.e., adjustment) capacitance configured to produce a desired reference voltage.

The system and method may further include a two stage sense amplifier. A reference voltage is produced from the charges on the inherent capacitances by coupling the inputs of the sense amplifier, thus, also causing noise present in the sense circuitry to be common mode. The reference voltage is applied to a first input and a sense voltage related to the reference voltage and an output of a selected memory cell is applied to a second input of the sense amplifier. A first stage is configured to level shift negative input voltages to intermediate voltages referenced to a supply voltage $V_{CC}$. The intermediate voltages are output from the first stage and input to a second stage. The second stage converts the intermediate voltages to a logic level signal, i.e., logic one or logic zero, corresponding to $V_{CC}$ or $V_{SS}$. The sense amplifier is configured to provide relatively low energy, relatively high speed level shifting configured to produce a logic level output from a relatively low level input with relatively robust noise immunity.

EXAMPLES

Examples of the present disclosure include subject material such as a method, means for performing acts of the method, a device, or of an apparatus or system related to a reference architecture in a cross-point memory, as discussed below.

Example 1

According to this example there is provided an apparatus including a memory controller configured to select a target memory cell for a memory access operation. The memory controller includes word line (WL) switch circuitry configured to select a global WL (GWL) and a local WL (LWL) associated with the target memory cell. The memory controller further includes bit line (BL) switch circuitry configured to select a global BL (GBL) and a local BL (LBL) associated with the target memory cell; and sense circuitry. The sense circuitry includes a first sense circuitry capacitance and a second sense circuitry capacitance. The sense circuitry is configured to precharge the selected GWL, the LWL and the first sense circuitry capacitance to a WL bias voltage WLVDM. The sense circuitry is further configured to produce a reference voltage ($V_{REF}$) utilizing charge on the selected GWL and charge on the first sense circuitry capacitance. The sense circuitry is further configured to determine a state of the target memory cell based, at least in part, on $V_{REF}$ and a detected memory cell voltage $V_{LWL}$.

Example 2

This example includes the elements of example 1, wherein the BL switch circuitry is configured to apply a BL bias voltage (BLVDM) to the selected LBL.

Example 3

This example includes the elements of example 1, further including an adjustment capacitance, wherein $V_{REF}$ is based, at least in part, on the adjustment capacitance.

Example 4

This example includes the elements of example 3, wherein the adjustment capacitance comprises at least one of trim capacitor circuitry and an unselected GWL.

Example 5

This example includes the elements of example 3 or 4, wherein a sum of GWL capacitance and the first sense circuitry capacitance is equal to a sum of the second sense circuitry capacitance and the adjustment capacitance.

Example 6

This example includes the elements of example 4, wherein the trim capacitor circuitry is a binary weighted trim capacitor.

Example 7

This example includes the elements of any one of examples 1 through 3, wherein the $V_{REF}$ is equal to one-half of WLVDM.

Example 8

This example includes the elements of example 3 or 4, wherein the adjustment capacitance is configured to adjust $V_{REF}$ so that $V_{REF}$ is greater than or less than one-half of WLVDM.

Example 9

This example includes the elements of example 4, wherein the trim capacitor circuitry is configured to be shared by an adjacent memory portion.

Example 10

This example includes the elements of any one of examples 1 through 3, further including a sense amplifier including a first input coupled to the second sense circuitry capacitance and a second input coupled to the first sense circuitry capacitance, the sense circuitry configured to couple the first input to the second input to produce $V_{REF}$.

Example 11

This example includes the elements of example 10, wherein the sense amplifier is configured to receive a sensed voltage ($V_{SENSE}$) related to $V_{REF}$ and $V_{LWL}$, to level shift $V_{SENSE}$ and $V_{REF}$ to intermediate positive-referenced voltages and to convert the intermediate voltages to a logic level output that corresponds to the state of the target memory cell.

Example 12

According to this example there is provided a method including selecting, by a memory controller, a target memory cell for a memory access operation; selecting, by word line (WL) switch circuitry, a global WL (GWL) and a local WL (LWL) associated with the target memory cell; selecting, by bit line (BL) switch circuitry, a global BL (GBL) and a local BL (LBL) associated with the target memory cell; precharging, by sense circuitry, the selected GWL, the LWL and a first sense circuitry capacitance to a WL bias voltage WLVDM; producing, by the sense circuitry, a reference voltage ($V_{REF}$) utilizing charge on the selected GWL and charge on the first sense circuitry capacitance; and determining, by the sense circuitry, a state of the target memory cell based, at least in part, on $V_{REF}$ and a detected memory cell voltage $V_{LWL}$.

Example 13

This example includes the elements of example 12, and further includes applying, by the BL switch circuitry, a BL bias voltage (BLVDM) to the selected LBL.

Example 14

This example includes the elements of example 12, wherein $V_{REF}$ is based, at least in part, on an adjustment capacitance.

Example 15

This example includes the elements of example 14, wherein the adjustment capacitance comprises at least one of trim capacitor circuitry and an unselected GWL.

Example 16

This example includes the elements of example 14, wherein a sum of GWL capacitance and the first sense circuitry capacitance is equal to a sum of a second sense circuitry capacitance and the adjustment capacitance.

Example 17

This example includes the elements of example 15, wherein the trim capacitor circuitry is a binary weighted trim capacitor.

Example 18

This example includes the elements of example, wherein the $V_{REF}$ is equal to one-half of WLVDM.

Example 19

This example includes the elements of example 14, wherein the adjustment capacitance is configured to adjust $V_{REF}$ so that $V_{REF}$ is greater than or less than one-half of WLVDM.

Example 20

This example includes the elements of example 15, wherein the trim capacitor circuitry is configured to be shared by an adjacent memory portion.

Example 21

This example includes the elements of example 12, and further includes coupling, by the sense circuitry, a first input of a sense amplifier to a second input of the sense amplifier to produce $V_{REF}$, the first input coupled to a second sense circuitry capacitance and the second input coupled to the first sense circuitry capacitance.

Example 22

This example includes the elements of example 21, and further includes receiving, by the sense amplifier, a sensed voltage ($V_{SENSE}$) related to $V_{REF}$ and $V_{LWL}$; level shifting, by the sense amplifier, $V_{SENSE}$ and $V_{REF}$ to intermediate positive-referenced voltages; and converting, by the sense amplifier, the intermediate voltages to a logic level output that corresponds to the state of the target memory cell.

Example 23

According to this example there is provided a system including a processor; a cross-point memory array including a target memory cell, a target word line (WL) and a target bit line (BL). The target memory cell is coupled between the target WL and the target BL. The system further includes a memory controller coupled to the processor and the cross-point memory array. The memory controller is configured to select a target memory cell for a memory access operation. The memory controller includes word line (WL) switch circuitry configured to select a global WL (GWL) and a local WL (LWL) associated with the target memory cell; bit line (BL) switch circuitry configured to select a global BL (GBL) and a local BL (LBL) associated with the target memory cell; and sense circuitry. The sense circuitry includes a first sense circuitry capacitance and a second sense circuitry capacitance. the sense circuitry is configured to precharge the selected GWL, the LWL and the first sense circuitry capacitance to a WL bias voltage WLVDM. The sense circuitry is further configured to produce a reference voltage ($V_{REF}$) utilizing charge on the selected GWL and charge on the first sense circuitry capacitance and determine a state of the target memory cell based, at least in part, on $V_{REF}$ and a detected memory cell voltage $V_{LWL}$.

Example 24

This example includes the elements of example 23, wherein the BL switch circuitry is configured to apply a BL bias voltage (BLVDM) to the selected LBL.

Example 25

This example includes the elements of example 23, further comprising an adjustment capacitance, wherein $V_{REF}$ is based, at least in part, on the adjustment capacitance.

Example 26

This example includes the elements of example, wherein the adjustment capacitance comprises at least one of trim capacitor circuitry and an unselected GWL.

Example 27

This example includes the elements of example claim 25 or 26, wherein a sum of GWL capacitance and the first sense circuitry capacitance is equal to a sum of the second sense circuitry capacitance and the adjustment capacitance.

Example 28

This example includes the elements of example 26, wherein the trim capacitor circuitry is a binary weighted trim capacitor.

Example 29

This example includes the elements of example 23 through 25, wherein the $V_{REF}$ is equal to one-half of WLVDM.

Example 30

This example includes the elements of example 25 or 26, wherein the adjustment capacitance is configured to adjust $V_{REF}$ so that $V_{REF}$ is greater than or less than one-half of WLVDM.

Example 31

This example includes the elements of example 26, wherein the trim capacitor circuitry is configured to be shared by an adjacent memory portion.

Example 32

This example includes the elements of any one of examples 23 through 25, further including a sense amplifier including a first input coupled to the second sense circuitry capacitance and a second input coupled to the first sense circuitry capacitance, the sense circuitry configured to couple the first input to the second input to produce $V_{REF}$.

Example 33

This example includes the elements of example 32, wherein the sense amplifier is configured to receive a sensed voltage ($V_{SENSE}$) related to $V_{REF}$ and $V_{LWL}$, to level shift $V_{SENSE}$ and $V_{REF}$ to intermediate positive-referenced voltages and to convert the intermediate voltages to a logic level output that corresponds to the state of the target memory cell.

Example 34

Another example of the present disclosure is a system including at least one device arranged to perform the method of any one of claims 12 to 22.

Example 35

Another example of the present disclosure is a device comprising means to perform the method of any one of claims 12 to 22.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:
1. An apparatus comprising:
a memory controller configured to select a target memory cell for a memory access operation, the memory controller comprising:
word line (WL) switch circuitry configured to select a global WL (GWL) and a local WL (LWL) associated with the target memory cell;
bit line (BL) switch circuitry configured to select a global BL (GBL) and a local BL (LBL) associated with the target memory cell; and
sense circuitry comprising a first sense circuitry capacitance and a second sense circuitry capacitance, the sense circuitry configured to precharge the selected GWL, the LWL and the first sense circuitry capacitance to a WL bias voltage WLVDM, produce a reference voltage ($V_{REF}$) utilizing charge on the selected GWL and charge on the first sense circuitry capaci- tance and determine a state of the target memory cell based, at least in part, on $V_{REF}$ and a detected memory cell voltage $V_{LWL}$.

2. The apparatus of claim 1, wherein the BL switch circuitry is configured to apply a BL bias voltage (BLVDM) to the selected LBL.

3. The apparatus of claim 1, further comprising an adjustment capacitance, wherein $V_{REF}$ is based, at least in part, on the adjustment capacitance.

4. The apparatus of claim 3, wherein the adjustment capacitance comprises at least one of trim capacitor circuitry and an unselected GWL.

5. The apparatus of claim 3, wherein a sum of GWL capacitance and the first sense circuitry capacitance is equal to a sum of the second sense circuitry capacitance and the adjustment capacitance.

6. The apparatus of claim 4, wherein the trim capacitor circuitry is a binary weighted trim capacitor.

7. The apparatus of claim 1, further comprising a sense amplifier comprising a first input coupled to the second sense circuitry capacitance and a second input coupled to the first sense circuitry capacitance, the sense circuitry configured to couple the first input to the second input to produce $V_{REF}$.

8. The apparatus of claim 7, wherein the sense amplifier is configured to receive a sensed voltage ($V_{SENSE}$) related to $V_{REF}$ and $V_{LWL}$, to level shift $V_{SENSE}$ and $V_{REF}$ to intermediate positive-referenced voltages and to convert the intermediate voltages to a logic level output that corresponds to the state of the target memory cell.

9. A method comprising:
selecting, by a memory controller, a target memory cell for a memory access operation;
selecting, by word line (WL) switch circuitry, a global WL (GWL) and a local WL (LWL) associated with the target memory cell;
selecting, by bit line (BL) switch circuitry, a global BL (GBL) and a local BL (LBL) associated with the target memory cell;
precharging, by sense circuitry, the selected GWL, the LWL and a first sense circuitry capacitance to a WL bias voltage WLVDM;
producing, by the sense circuitry, a reference voltage ($V_{REF}$) utilizing charge on the selected GWL and charge on the first sense circuitry capacitance; and
determining, by the sense circuitry, a state of the target memory cell based, at least in part, on $V_{REF}$ and a detected memory cell voltage $V_{LWL}$.

10. The method of claim 9, further comprising:
applying, by the BL switch circuitry, a BL bias voltage (BLVDM) to the selected LBL.

11. The method of claim 9, wherein $V_{REF}$ is based, at least in part, on the adjustment capacitance.

12. The method of claim 11, wherein the adjustment capacitance comprises at least one of trim capacitor circuitry and an unselected GWL.

13. The method of claim 11, wherein a sum of GWL capacitance and the first sense circuitry capacitance is equal to a sum of a second sense circuitry capacitance and the adjustment capacitance.

14. The method of claim 12, wherein the trim capacitor circuitry is a binary weighted trim capacitor.

15. The method of claim 9, further comprising:
coupling, by the sense circuitry, a first input of a sense amplifier to a second input of the sense amplifier to produce $V_{REF}$, the first input coupled to a second sense circuitry capacitance and the second input coupled to the first sense circuitry capacitance.

16. The method of claim 15, further comprising:
receiving, by the sense amplifier, a sensed voltage ($V_{SENSE}$) related to $V_{REF}$ and $V_{LWL}$;
level shifting, by the sense amplifier, $V_{SENSE}$ and $V_{REF}$ to intermediate positive-referenced voltages; and
converting, by the sense amplifier, the intermediate voltages to a logic level output that corresponds to the state of the target memory cell.

17. A system comprising:
a processor;
a cross-point memory array comprising a target memory cell, a target word line (WL) and a target bit line (BL), the target memory cell coupled between the target WL and the target BL; and
a memory controller coupled to the processor and the cross-point memory array, the memory controller configured to select a target memory cell for a memory access operation, the memory controller comprising:
word line (WL) switch circuitry configured to select a global WL (GWL) and a local WL (LWL) associated with the target memory cell;
bit line (BL) switch circuitry configured to select a global BL (GBL) and a local BL (LBL) associated with the target memory cell; and
sense circuitry comprising a first sense circuitry capacitance and a second sense circuitry capacitance, the sense circuitry configured to precharge the selected GWL, the LWL and the first sense circuitry capacitance to a WL bias voltage WLVDM, produce a reference voltage ($V_{REF}$) utilizing charge on the selected GWL and charge on the first sense circuitry capacitance and determine a state of the target memory cell based, at least in part, on $V_{REF}$ and a detected memory cell voltage $V_{LWL}$.

18. The system of claim 17, wherein the BL switch circuitry is configured to apply a BL bias voltage (BLVDM) to the selected LBL.

19. The system of claim 17, further comprising an adjustment capacitance, wherein $V_{REF}$ is based, at least in part, on the adjustment capacitance.

20. The system of claim 19, wherein the adjustment capacitance comprises at least one of trim capacitor circuitry and an unselected GWL.

21. The system of claim 19, wherein a sum of GWL capacitance and the first sense circuitry capacitance is equal to a sum of the second sense circuitry capacitance and the adjustment capacitance.

22. The system of claim 20, wherein the trim capacitor circuitry is a binary weighted trim capacitor.

23. The system of claim 17, further comprising a sense amplifier comprising a first input coupled to the second sense circuitry capacitance and a second input coupled to the first sense circuitry capacitance, the sense circuitry configured to couple the first input to the second input to produce $V_{REF}$.

24. The system of claim 23, wherein the sense amplifier is configured to receive a sensed voltage ($V_{SENSE}$) related to $V_{REF}$ and $V_{LWL}$, to level shift $V_{SENSE}$ and $V_{REF}$ to intermediate positive-referenced voltages and to convert the intermediate voltages to a logic level output that corresponds to the state of the target memory cell.

* * * * *